United States Patent
Kobayashi et al.

(10) Patent No.: US 6,265,327 B1
(45) Date of Patent: Jul. 24, 2001

(54) METHOD FOR FORMING AN INSULATING FILM ON SEMICONDUCTOR SUBSTRATE SURFACE AND APPARATUS FOR CARRYING OUT THE METHOD

(75) Inventors: Hikaru Kobayashi, Kyoto; Kenji Yoneda, Takatsuki, both of (JP)

(73) Assignees: Japan Science and Technology Corp., Saitama; Matsushita Electronics Corp., Osaka, both of (JP)

( * ) Notice: Subject to any disclaimer, the term of this patent is extended or adjusted under 35 U.S.C. 154(b) by 0 days.

(21) Appl. No.: 09/098,352

(22) Filed: Jun. 17, 1998

(30) Foreign Application Priority Data

Jun. 20, 1997 (JP) .................................................... 9-164513

(51) Int. Cl.[7] .................................................. H01L 21/31
(52) U.S. Cl. ........................ 438/776; 438/765; 438/771; 438/772; 438/775; 438/FOR 117; 438/961
(58) Field of Search ..................................... 438/765, 766, 438/771, 772, 773, 777, 778, 276, 680, 783, 754, 961, 977, FOR 117, 775

(56) References Cited

U.S. PATENT DOCUMENTS

| | | | | |
|---|---|---|---|---|
| 4,135,097 | * | 1/1979 | Forneris et al. | 250/492.3 |
| 4,147,573 | * | 4/1979 | Morimoto | 117/97 |
| 4,179,312 | * | 12/1979 | Keller et al. | 117/9 |
| 4,870,030 | * | 9/1989 | Markunas et al. | 117/90 |
| 4,929,986 | * | 5/1990 | Yoder | 257/275 |
| 5,055,696 | * | 10/1991 | Haraichi et al. | 250/492.2 |
| 5,180,435 | * | 1/1993 | Markunas et al. | 118/723 |
| 5,334,554 | * | 8/1994 | Lin et al. | 438/624 |
| 5,569,499 | * | 10/1996 | Maeda et al. | 427/539 |
| 5,672,521 | * | 9/1997 | Barsan et al. | 438/276 |
| 5,716,870 | * | 2/1998 | Foster et al. | 438/675 |

FOREIGN PATENT DOCUMENTS

10064477 * 3/1998 (JP) ........................................ 37/317

OTHER PUBLICATIONS

Kern et al., Cleaning Solutions Based on Hydrogen Peroxide for use in Silicon Semiconductor Technology.
Fazan et al., Applied Surface Science 30 (1987) 224–228, Apr. 13, 1987.
J. Applied Phys. 74(8) Oct. 15, 1993 5042–5046.

* cited by examiner

*Primary Examiner*—Trung Dang
*Assistant Examiner*—Brook Kebede
(74) *Attorney, Agent, or Firm*—Jones, Tullar & Cooper, PC

(57) ABSTRACT

Disclosed are a method and apparatus for forming an insulating film on the surface of a semiconductor substrate capable of improving the quality and electrical properties of the insulating film with no employment of high-temperature heating and with good controllability. After the surface of a silicon substrate is cleaned, a silicon dioxide film having a thickness of 1–20 nm is formed on the substrate surface. The silicon substrate is exposed to plasma generated by electron impact, while the silicon substrate is maintained at a temperature of 0° C. to 700° C. Thus, nitrogen atoms are incorporated into the silicon dioxide film, obtaining a modified insulating film having good electrical properties.

11 Claims, 8 Drawing Sheets

METHOD FOR FORMING AN INSULATING FILM ON SEMICONDUCTOR SUBSTRATE SURFACE AND APPARATUS FOR CARRYING OUT THE METHOD

BACKGROUND OF THE INVENTION

1. Field of the Invention

The present invention relates to a method for forming an insulating film on the surface of a semiconductor substrate and to an apparatus for carrying out the method.

2. Description of the Related Art

Conventionally, silicon oxynitride films are used as gate insulation films and capacitor insulating films for semiconductor devices, particularly, when they are silicon devices, MOS (Metal Oxide Semiconductor) transistors and MOS capacitors. These insulating films must have a high dielectric breakdown voltage and a high dielectric breakdown charge amount. A wafer cleaning process plays an important role in attainment of the requirement, as wafers must be properly cleaned and have a low fixed electric charge density and a low interface state density.

Along with a recent tendency to reduce the geometry and increase integration of semiconductor device circuits, gate insulating films and capacitor insulating films are becoming thinner. For example, under the design rule of 0.1 $\mu$m or less, gate insulating films must be as thin as 3 nm or less.

According to a conventional method for forming gate insulating films of MOS transistors, a semiconductor substrate is exposed to an atmosphere of dinitrogen monoxide ($N_2O$) or nitrogen monoxide (NO) at a high temperature of about 1000° C. Alternatively, a wafer is heated to a temperature of about 700° C. in an ammonia atmosphere.

Also, conventional methods for forming oxynitride films at low temperatures include the following: thermal oxynitridation is performed while ultraviolet rays are radiated; and silicon is directly nitrided through exposure to nitrogen compound plasma or nitrogen gas plasma. However, these methods fail to form thin high-quality oxynitride films with good controllability and reproducibility.

Conventionally practiced thermal oxynitridation using $N_2O$ gas has involved the following problems: heating at high temperatures is required; the amount of nitrogen atoms incorporated into a formed oxynitride film is relatively small; and the quality of a silicon dioxide film is not sufficiently improved. According to conventionally practiced thermal oxynitridation using NO gas, a heating temperature is as low as about 900° C., and the amount of nitrogen atoms incorporated into a formed oxynitride film increases somewhat; however, the method has involved the problem that the thickness of a formed oxynitride film cannot be made greater than a certain level. Conventionally practiced thermal oxynitridation using ammonia gas has involved the following problem. A formed oxynitride film contains a large amount of hydrogen, which serves as an electron trap, causing an impairment in film quality. Thus, in order to eliminate hydrogen, after an oxynitride film is formed, the film must be heated to a temperature of about 1000° C. or must be oxidized.

Also, conventionally practiced direct oxynitridation using plasma has involved the problem that film quality is impaired due to plasma damage. Particularly, the generation of interface state not only impairs hot-carrier properties of a transistor but also causes an unstable threshold voltage of a transistor and impaired mobility of carriers, which induce a fatal problem for, particularly, fine-patterned devices.

Further, the fine patterning of an element requires a reduction in thermal treatment temperature. Accordingly, high-temperature heating has raised the problems of dopant diffusion and defect generation. In RF-plasma-activated oxynitridation of a silicon dioxide film, the use of $NH_3$ plasma enables a relatively large amount of nitrogen atoms to be incorporated into the film, but causes a relatively large amount of hydrogen atoms to also be incorporated into the film. As a result, impairment in film quality is involved.

Also, the use of $N_2$ plasma has involved insufficient improvement of film quality, since the amount of nitrogen atoms incorporated into a film is relatively small. (Refer to, for example, P. Fazan, M. Dutoit and M. Ilegems, "Applied Surface Science" Vol. 30, p. 224, 1987.)

SUMMARY OF THE INVENTION

The present invention has been accomplished to solve the above-mentioned problems involved in conventional methods for forming an insulating film into which nitrogen atoms are incorporated. An object of the present invention is to provide a method for forming on the surface of a semiconductor substrate a high-quality insulating film into which a large amount of nitrogen atoms are incorporated, without the use of high-temperature heating and with good controllability.

To achieve the above object, the present invention provides a method for forming an insulating film on the surface of a semiconductor substrate, comprising a step of exposing to plasma generated by electron impact an insulating film deposited on the surface of the semiconductor substrate. Through exposure to plasma, the insulating film is modified. Preferably, an adequate voltage is applied between an electron source or a grid electrode and the semiconductor substrate so as to prevent the occurrence of a charge-up effect on the insulating film during exposure to plasma.

Preferably, the insulating film to be exposed to plasma is a silicon dioxide film having a thickness of 1–20 nm. This thickness range provides an appropriate final film thickness to ultra-thin gate insulating films and capacitor insulating films of MIS transistors and MIS capacitors. The silicon dioxide film is deposited on a substrate through thermal oxidation, chemical vapor-phase growth, chemical oxidation, physical vapor-phase growth, plasma-assisted chemical vapor-phase growth, or the like.

Preferably, the semiconductor substrate is formed of at least a single material selected from the group consisting of single crystalline silicon, polycrystalline silicon, amorphous silicon, gallium arsenide, indium phosphide, silicon carbide, silicon germanium, and silicon germanium carbide. These materials expand the range of applications of semiconductor substrates formed thereof.

Preferably, plasma is generated by electron impact on a single gas selected from the group consisting of the following A through H:

A. Nitrogen gas

B. $N_2O$ gas

C. NO gas

D. Ammonia gas

E. The mixture of two or more gases of A to D

F. The mixture of any of A to D and an inert gas such as argon, neon, or the like G. The mixture of any of A to D and dry oxygen H. The mixture of any of A to D and steam-containing oxygen Any of the above gases A to H are suited for modifying, through nitridation, a silicon dioxide film deposited on, for example, a silicon substrate of a semiconductor.

Preferably, exposure to plasma is performed while a heat treatment temperature is maintained within the range of 0° C. to 700° C. Low-temperature oxynitridation enables the achievement of the object of the present invention.

According to the above-mentioned method of the present invention, an insulating film having a thickness of 1–20 nm is deposited on a semiconductor substrate. Subsequently, the thus-deposited insulating film is exposed to plasma generated by electron impact while semiconductor substrate temperature is maintained at 700° C. or lower. As a result, an insulating film having uniformly high quality can be formed on a semiconductor substrate in an efficient, rational manner and with good controllability.

In the thus-formed insulating film, nitrogen atoms are contained at a relatively high concentration near the surface of the film and near the interface between the insulating film and the semiconductor substrate. Nitrogen atoms contained near the interface improve interface properties and enable the formation of a high-quality insulating film having a low interface state density.

Further, nitrogen atoms contained in the thus-formed insulating film near the surface improve surface properties of the insulating film. Thus, the insulating film becomes sufficiently fine against diffusion thereinto of impurities, such as boron.

The quality of an insulating film formed in accordance with the present invention depends on a method of depositing an original insulating film on a semiconductor surface. Also, an oxynitridation rate, the nitrogen content of an insulating film, and the depthwise distribution of nitrogen contained in an insulating film depend on the temperature and time of heat treatment, the type of gaseous atmosphere, the temperature of a thermoelectron source for carrying out electron impact, and a voltage applied between a grid and a filament for acceleration of electrons. Under preferred conditions of the present invention, an insulating film deposited on a semiconductor substrate can be nitrided at a temperature of 0° C. to 700° C.

According to the present invention, an insulating film can be modified at a low temperature not higher than 700° C. through exposure to plasma generated by electron impact. Through use of the thus-modified insulating film as a gate insulating film, an MOS device having high performance can be realized.

BRIEF DESCRIPTION OF THE DRAWINGS

The structure and features of the method and apparatus for forming an insulating film on the surface of a semiconductor substrate according to the present invention will be readily appreciate as the same becomes better understood by referring drawings, in which.

BRIEF DESCRIPTION OF THE PREFERRED EMBODIMENTS

Embodiments of the present invention will next be described in detail with reference to the drawings.

FIGS. 1A to 1F show a process of forming an insulating film on a semiconductor substrate according to a first embodiment of the present invention. In the present embodiment, an MOS capacitor is formed on a silicon substrate, which is an example of the semiconductor substrate.

Figure 1A:
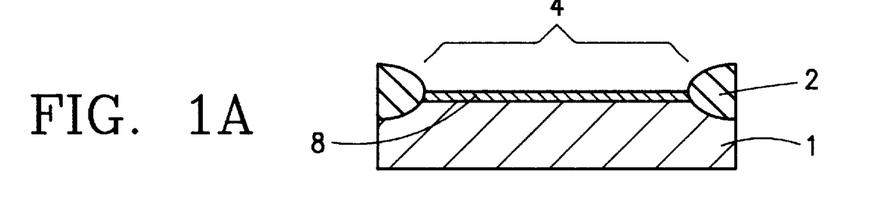
FIGS. 1A to 1F are sectional views showing a process of forming an MOS capacitor through use of a method for modifying an insulating film deposited on a semiconductor substrate according to a first embodiment of the present invention.

(1) An isolation region 2 and an active region 4 were formed on a silicon substrate 1 through use of a known selective oxidation technique. A native oxide film 8 was present on the surface of the active region 4 (FIG. 1A). Specifically, the silicon substrate 1 was a p-type (100) substrate having a resistivity of 10–15 Ωcm. The isolation region 2 was an LOCOS (local oxidation of silicon) oxide film having a thickness of 500 nm.

Figure 1B:
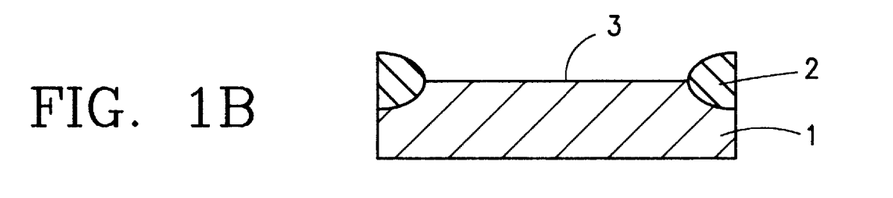

(2) In order to clean the active region 4, a wafer was cleaned by a known RCA cleaning method (W. Kern, D. A. Plutien: RCA Review, 31, pp. 187, 1970). Subsequently, the wafer was immersed in a dilute HF solution (0.5 vol. % aqueous solution of HF) for 5 minutes, thereby removing the native oxide film 8 from the surface of the silicon substrate 1 (FIG. 1B). In order to form a high-quality silicon dioxide film on a silicon substrate surface 3, the surface 3 must be clean. Accordingly, after removal of the native oxide film 8 from the surface 3, impurities must be removed from the surface 3.

Figure 1C:
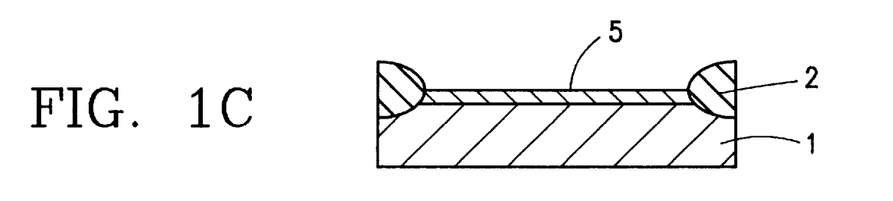

(3) The wafer was rinsed with ultrapure water for 5 minutes. Subsequently, the wafer was oxidized at a temperature of 850° C. in a steam-containing oxygen atmosphere, thereby forming a silicon dioxide film 5 having a thickness of 8 nm on the silicon substrate 1 (FIG. 1C). In addition to the above-mentioned thermal oxidation method of the present embodiment, methods of forming an insulating film on a semiconductor substrate surface include the following: a vapor-phase growth method in which monosilane is thermally decomposed and deposited on a substrate surface; a sputtering method; an electron beam evaporation method; a resistance heating evaporation method; an anode oxidation method; and a chemical method for forming a silicon dioxide film in which a semiconductor is immersed in nitric acid, perchloric acid, or the like.

As mentioned above in (2), the native oxide film 8 must be removed completely in order to form, in the next step, the clean, homogenous silicon dioxide film 5.

Figure 1D:
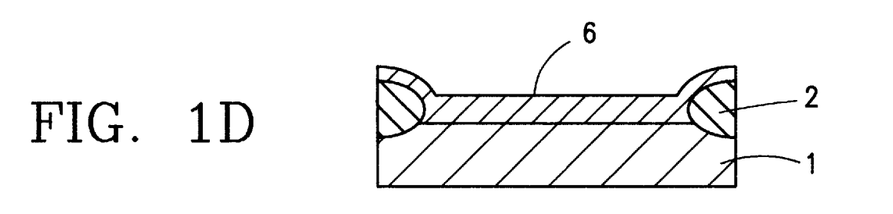

(4) A tungsten filament was heated to a temperature of 1400° C. in a nitrogen atmosphere having a reduced pressure of $1.5 \times 10^{-2}$ Torr. A voltage of 53 V was applied between the filament and a grid electrode so as to accelerate thermoelectrons emitted from the filament and to make the accelerated thermoelectrons impinged on nitrogen molecules, thereby generating nitrogen plasma. The silicon dioxide film 5 was exposed to the generated plasma, obtaining a modified insulating film 6 (FIG. 1D). In this case, the semiconductor substrate was heated to a temperature of 700° C. or allowed to stand at room temperature. A voltage of −10 V with respect to the grid electrode was applied to the semiconductor substrate. As a result of this voltage application, positive ions and electrons in plasma impinge, in the same amount, on the semiconductor substrate. Consequently, current became zero in the impingement position of the semiconductor substrate, thereby preventing damage to the insulating film 6 which would otherwise result from a charge-up effect.

Figure 1E:
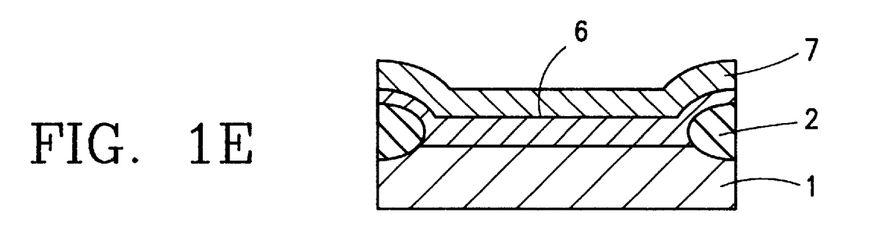
Figure 1F:
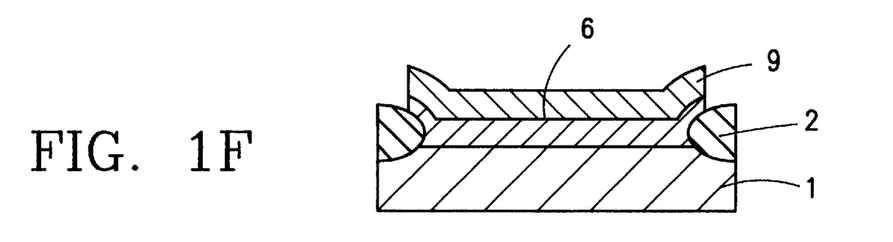

(5) An aluminum film 7 was deposited in a thickness of 1 $\mu$m through sputtering (FIG. 1E). A gate electrode was patterned on the aluminum film 7 by a known photolithography technique. Subsequently, the aluminum film 7 was etched by a known dry etching technique, thereby forming a gate electrode 9 (FIG. 1F).

Figure 2:
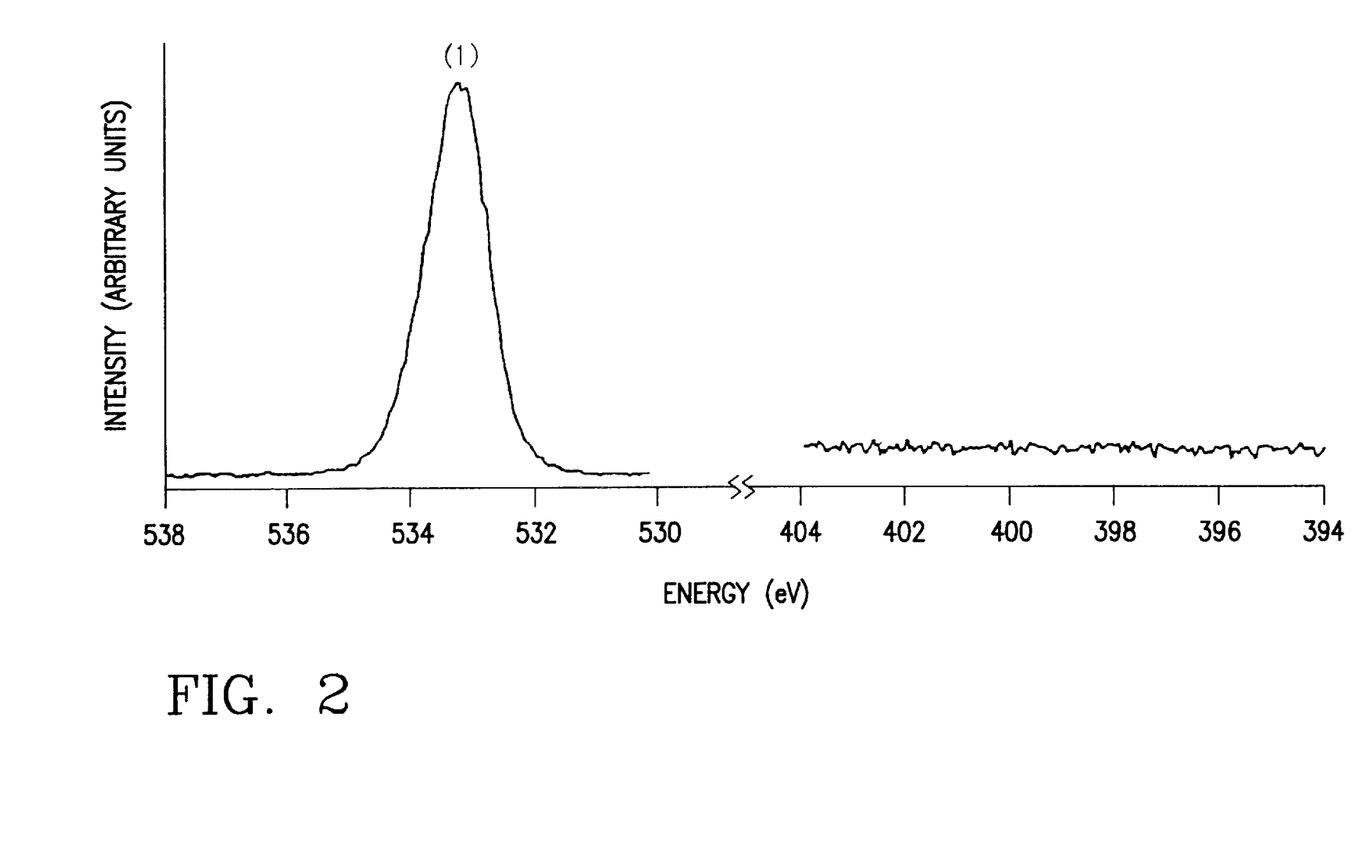
FIG. 2 is a graph showing x-ray photoelectron spectroscopy spectra which were observed by spectroscopic measurement of a silicon dioxide film formed by heating a silicon substrate at a temperature of 850° C. for 12 minutes in a steam-containing oxygen atmosphere after washing and removal of native oxide film.

FIG. 2 shows x-ray photoelectron spectroscopy (hereinafter referred to as XPS) spectra which were observed by spectroscopic measurement of the silicon dioxide film 5 after the silicon wafer was heated at a temperature of 850° C. for 12 minutes in the steam-containing oxygen atmosphere.

The above-mentioned XPS spectra were measured through use of a spectrometer, ESCALAB220i-XL, from VG SCIENTIFIC. In this case, an employed X-ray source was an Al K$\alpha$ radiation source having an energy of 1487 eV. Photoelectrons were observed in a direction perpendicular to a film surface. A peak (1) is derived from photoelectrons from an O 1s orbital of the silicon dioxide film 5. The measured spectra reveals that no peak is present in an N 1s orbital region, indicating that nitrogen atoms are not contained in the silicon dioxide film 5.

Figure 3:
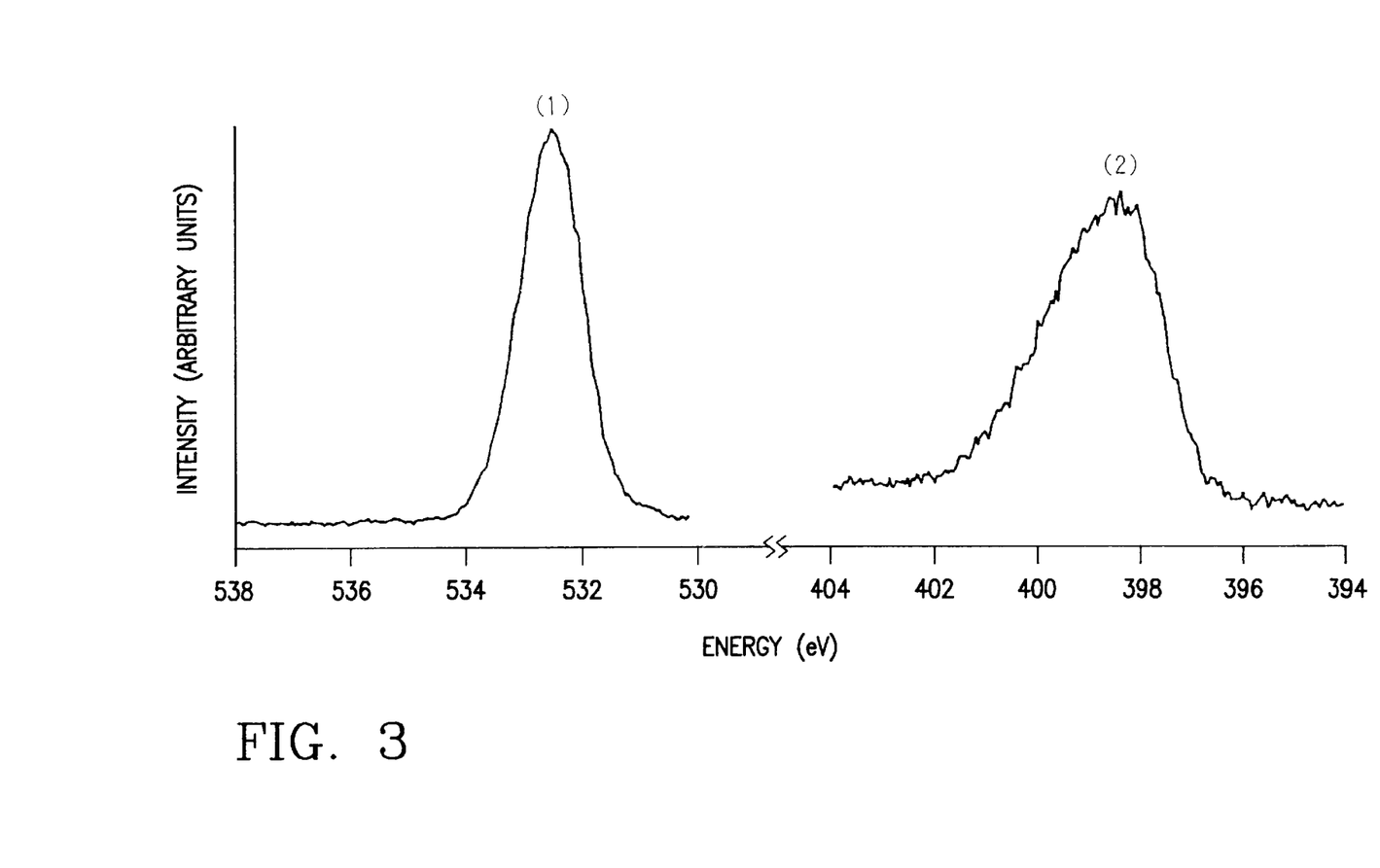
FIG. 3 is a graph showing x-ray photoelectron spectroscopy spectra which were observed by spectroscopic measurement of the silicon dioxide film which had been exposed, at 25° C. for 1 hour, to nitrogen plasma generated by electron impact.

FIG. 3 shows XPS spectra which were observed by spectroscopic measurement of the silicon dioxide film 5 which had been exposed, at 25° C. for 1 hour, to nitrogen plasma generated by electron impact in the step of FIG. 1D.

As seen from FIG. 3, a peak (2) is derived from photoelectrons from an N 1s orbital. Based on the areal intensity ratio between the peak (2) and the above-mentioned peak (1), the ratio of the number of nitrogen atoms contained in a surface region ranging from the surface to a depth of about 3 nm to the sum of the number of oxygen atoms contained in the region and the number of nitrogen atoms contained in the region was calculated as 29%. The depth of about 3 nm is a depth of release of photoelectrons. This indicates that through exposure of the silicon dioxide film 5 to nitrogen plasma generated by electron impact, nitrogen atoms are incorporated into the film, i.e., the film is modified.

Figure 4:
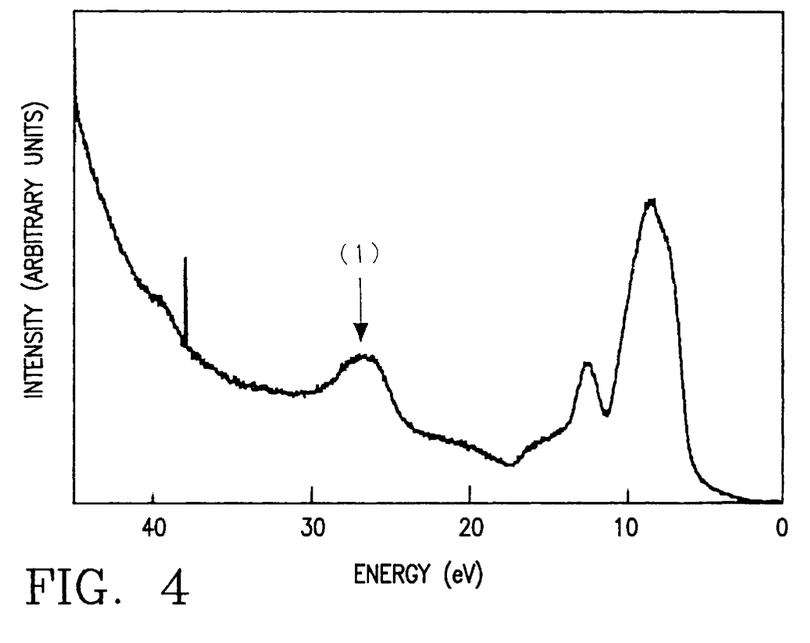
FIG. 4 is a graph showing synchrotron radiation ultraviolet photoelectron spectroscopy spectra which were observed by spectroscopic measurement of the silicon dioxide film formed on the silicon substrate.

FIG. 4 shows synchrotron radiation ultraviolet photoelectron spectroscopy (hereinafter referred to as UPS) spectra which were observed by spectroscopic measurement of the silicon dioxide film 5 formed on the silicon substrate.

The UPS spectra were measured at the National Laboratory for High Energy Physics through use of the BL-3B beam-line. In this case, the energy of an incident beam was 65 eV. Through absorption of the incident beam energy, photoelectrons are released over a depth of 6–7 angstroms. Accordingly, an observed region ranges from the surface to a depth of 6–7 angstroms. The employed reference of energy was Fermi level. A peak (1) is derived from photoelectrons from an O 2s orbital.

Figure 5:
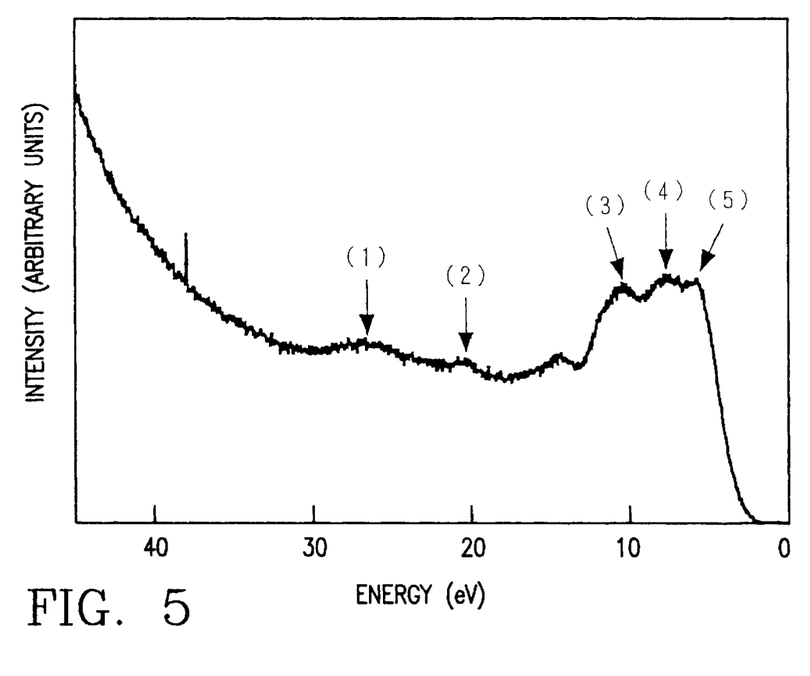
FIG. 5 is a graph showing synchrotron radiation ultraviolet photoelectron spectra which were observed by spectroscopic measurement of the silicon dioxide film which had been exposed, at 25° C. for 1 hour, to nitrogen plasma generated by electron impact.

FIG. 5 shows UPS spectra which were observed by spectroscopic measurement of the silicon dioxide film 5 which had been exposed, at 25° C. for 1 hour, to nitrogen plasma generated by electron impact in the step of FIG. 1D.

In this case, the energy of an incident beam was 65 eV. A peak (2) is derived from photoelectrons from an N 2s orbital of silicon nitride ($Si_3N_4$). A peak (3) is derived from photoelectrons from the mixed orbital of an N 2p orbital of $Si_3N_4$ and an Si 3s orbital of $Si_3N_4$. A peak (4) is derived from the mixed orbital of an N 2p orbital of $Si_3N_4$ and an Si 3p orbital of $Si_3N_4$. A peak (5) is derived from photoelectrons from an N 2p nonbonding orbital. (C. Senemaud, M. Driss-Khodja, A. Gheorghiu, S. Harel, G. Dufour, and H. Roulet, "Journal of Applied Physics," Vol. 74 (1993), p.5042)

The above spectral feature indicates that through exposure of the silicon dioxide film 5, at room temperature, to nitrogen plasma generated by electron impact, the surface region of the silicon dioxide film 5 was transformed to an $Si_3N_4$ layer, i.e., the silicon dioxide film 5 was modified.

Figure 6:
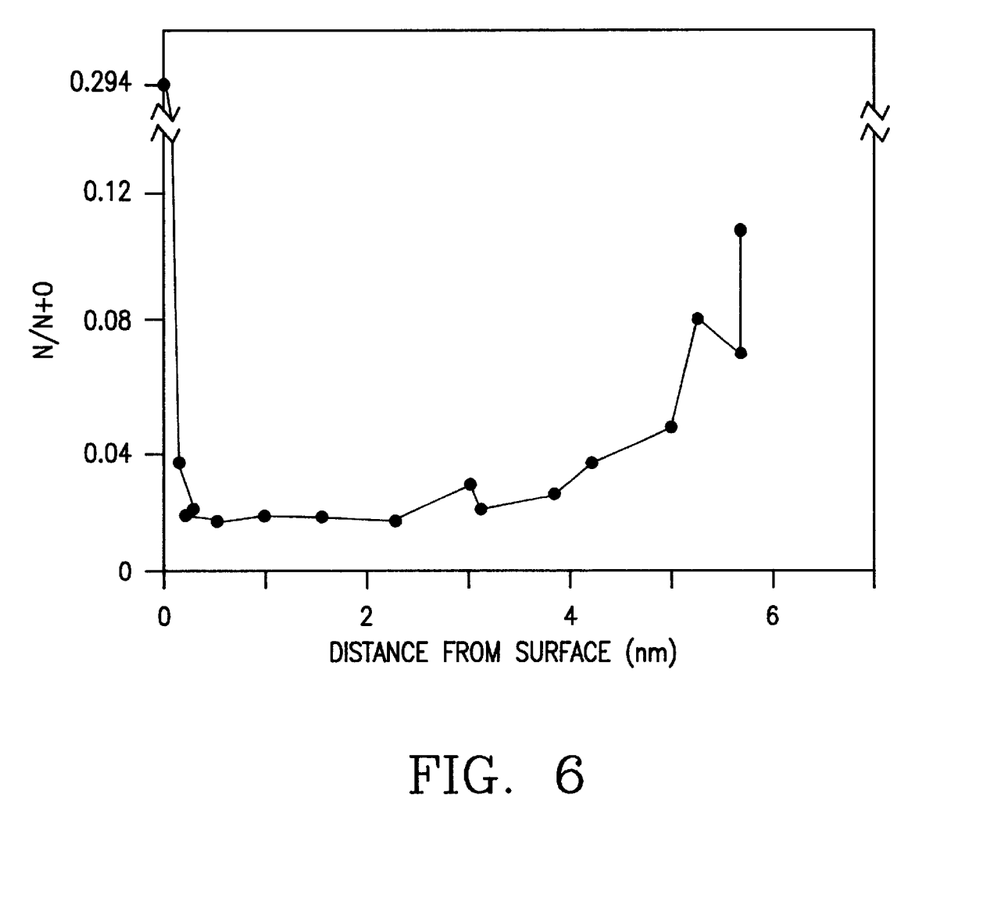
FIG. 6 is a graph showing the result of plotting the ratio of the quantity of nitrogen atoms to the sum of the quantity of oxygen atoms and the quantity of nitrogen atoms along distance from an insulating film surface for an insulating film which was obtained by modifying the silicon dioxide film through exposure, at 25° C. for 1 hour, to nitrogen plasma generated by electron impact.

FIG. 6 shows the result of plotting the ratio of the quantity of nitrogen atoms to the sum of the quantity of oxygen atoms and the quantity of nitrogen atoms along distance from an insulating film surface for the insulating film 6 which was obtained by modifying the silicon dioxide film 5 through exposure, at room temperature, to nitrogen plasma generated by electron impact.

The above plotted measurements were obtained in the following manner: the surface of the insulating film 6 was gradually etched by means of argon ions having a kinetic energy of 2 keV; subsequently, the film 6 was measured for XPS spectra. As seen from FIG. 6, the quantity of nitrogen atoms is large near the surface of the insulating film 6 and is next large near the interface between the insulating film 6 and the silicon substrate.

The above-mentioned increase in the quantity of nitrogen atoms near the interface is not caused by a nitrogen-atom drive phenomenon induced by incident argon ions, i.e., not caused by a knock-on effect of nitrogen atoms. If the knock-on effect is involved, the quantity of oxygen atoms must also increase near the interface because the mass of an oxygen atom is close to that of a nitrogen atom. However, the quantity of oxygen atoms is decreased near the interface.

Nitrogen atoms which exist near the surface of an insulating film prevent impurities, such as boron contained in a gate electrode of a P channel transistor of a dual gate CMOS device, from entering the insulating film.

Also, nitrogen atoms which exist near the surface of an insulating film conceivably terminate dangling bond, strain bond, or the like near the interface between an oxide film and an upper electrode (aluminum in the present embodiment; polycrystalline silicon in some case). Effects yielded by this feature include a reduction in interface state, an increase in dielectric breakdown charge amount, and dielectric breakdown voltage.

Also, a peak derived from nitrogen atoms is also observed near the interface between an oxide film and a silicon substrate. In an MOS structure, the interface between an oxide film and a silicon substrate plays a very important role in terms of electrical properties such as dielectric breakdown properties and interface properties. Nitrogen atoms which exist near the interface also firmly terminate dangling bond, broken bond, and strain bond near the interface, thereby reducing interface state density and preventing an impairment in a portion of an insulating film located near the interface which would otherwise occur due to application of a current stress. Thus, the method for forming an insulating film according to the present invention can modify properties of an insulating film in terms of both surface and interface, thereby enabling the realization of a high-performance ultra-thin insulating film.

Figure 7:
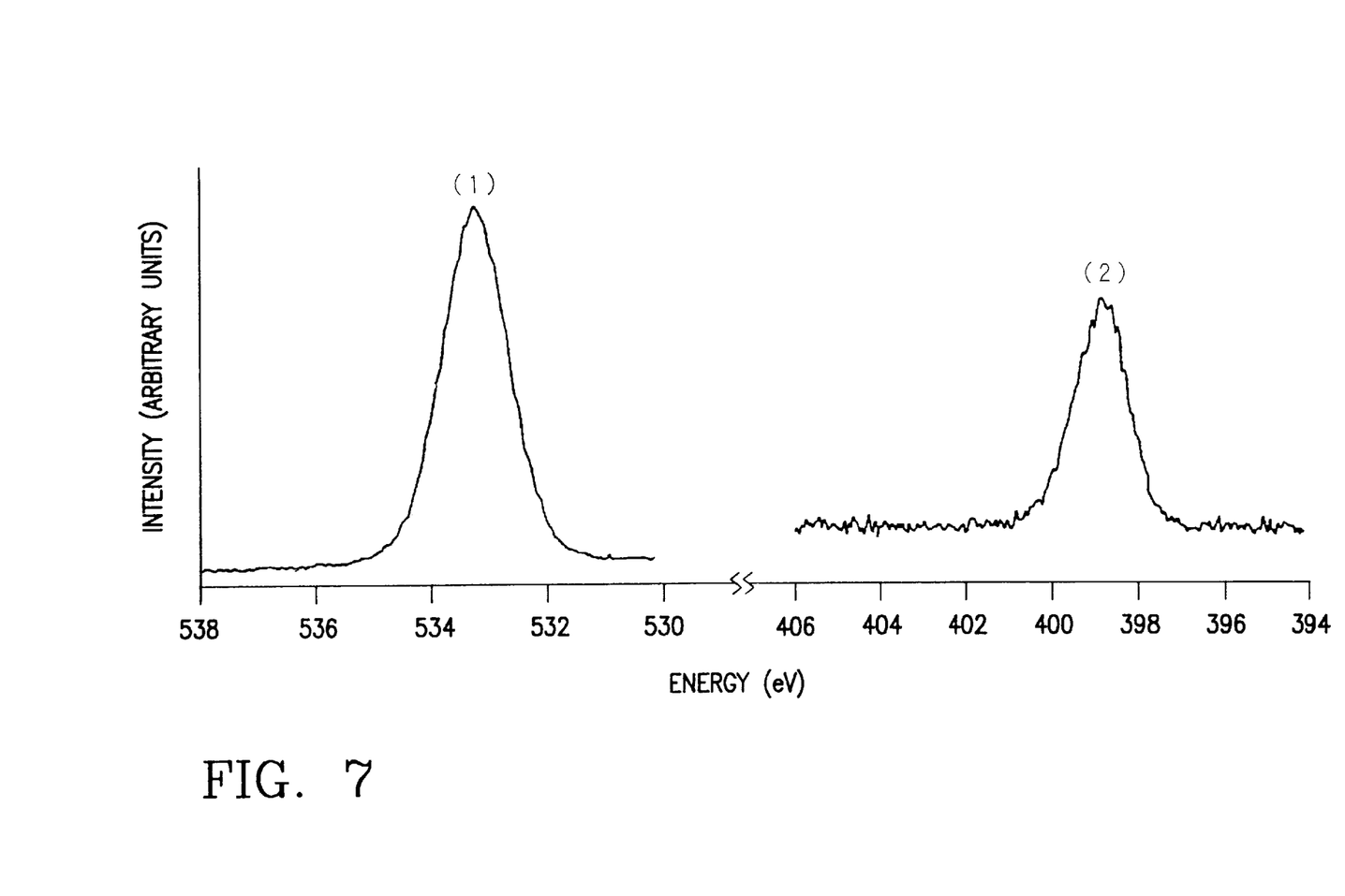
FIG. 7 is a graph showing x-ray photoelectron spectroscopy spectra which were observed by spectroscopic measurement of the silicon dioxide film which had been exposed, at 700° C. for 1 hour, to nitrogen plasma generated by electron impact.

FIG. 7 shows XPS spectra which were observed by spectroscopic measurement of the silicon dioxide film 5 which had been exposed, at 700° C. for 1 hour, to nitrogen plasma generated by electron impact.

Based on the areal intensity ratio between a peak (2) and a peak (1) derived from photoelectrons from an O 1s orbital, the ratio of the number of nitrogen atoms contained in a surface region ranging from the surface to a depth of about 3 nm to the sum of the number of oxygen atoms contained in the region and the number of nitrogen atoms contained in the region was calculated as 11%. Binding energy at the peak (1) revealed that 1 nitrogen atom was bound to 3 silicon atoms.

Figure 8:
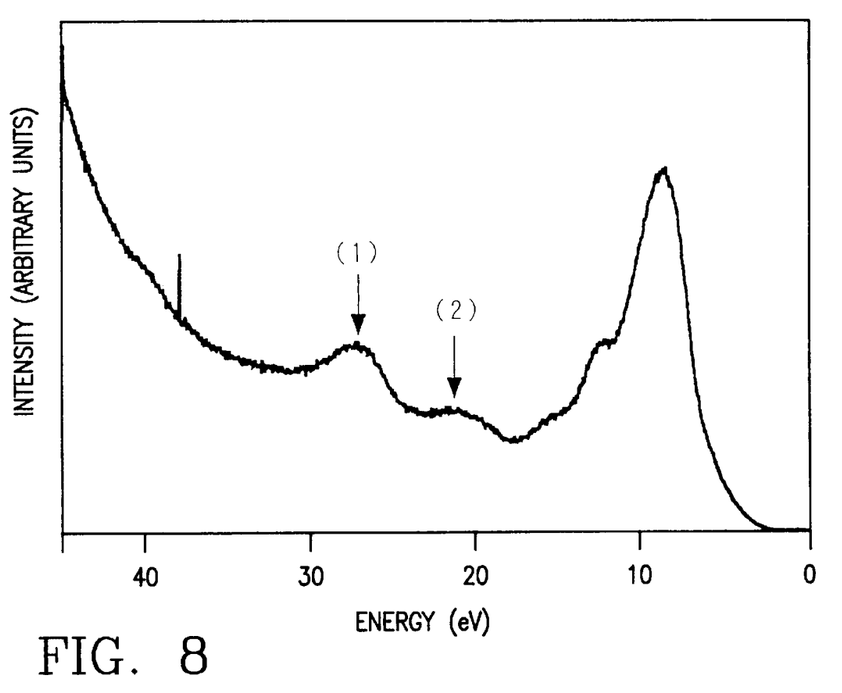
FIG. 8 is a graph showing synchrotron radiation ultraviolet photoelectron spectra which were observed by spectroscopic measurement of the silicon dioxide film which had been exposed, at 700° C. for 1 hour, to nitrogen plasma generated by electron impact.

FIG. 8 shows UPS spectra which were observed by spectroscopic measurement of the silicon dioxide film 5 which had been exposed, at 700° C. for 1 hour, to nitrogen plasma generated by electron impact.

A peak (1) is derived from photoelectrons from an O 2s orbital. A peak (2) is derived from photoelectrons from an N 2s orbital. A spectral profile over a binding energy range of 0 eV to 15 eV changes to some degree as a result of exposure of the silicon dioxide film 5 to nitrogen plasma. However, a peak derived from $Si_3N_4$ is not observed. A relatively small nitrogen content of 11% has revealed that an oxynitride film is formed at a surface region of the silicon dioxide film 5.

Figure 9:
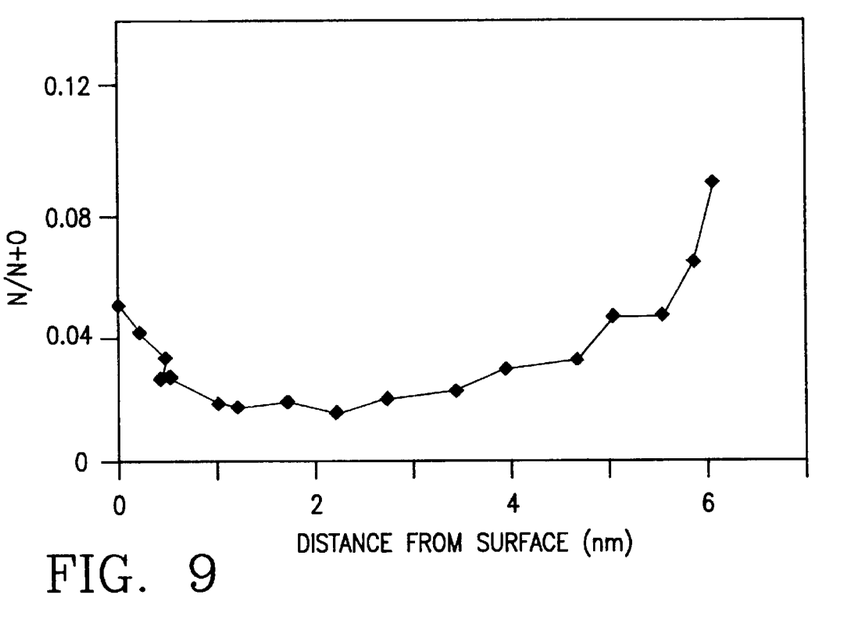
FIG. 9 is a graph showing the result of plotting the ratio of the quantity of nitrogen atoms to the sum of the quantity of oxygen atoms and the quantity of nitrogen atoms along distance from an insulating film surface for an insulating film which was obtained by modifying the silicon dioxide film through exposure, at 700° C. for 1 hour, to nitrogen plasma generated by electron impact.

FIG. 9 shows the result of plotting the ratio of the quantity of nitrogen atoms to the sum of the quantity of oxygen atoms and the quantity of nitrogen atoms along distance from an insulating film surface for the insulating film 6 which was obtained by modifying the silicon dioxide film 5 through exposure, at 700° C., to nitrogen plasma generated by electron impact. The plotted measurements reveal that the quantity of nitrogen atoms is relatively large near the surface of the film 6 and near the interface between the film 6 and the silicon substrate.

The above-mentioned results indicate that nitrogen can be contained in a surface region of an insulating film at a relatively high concentration when the heating temperature of a semiconductor substrate is rather low. The nitrogen concentration can be controlled through adjustment of the heating temperature. In the case of exposure, at room temperature, to plasma, the nitrogen concentration near the surface is significantly higher than that near the interface.

By contrast, in the case of exposure, at 700° C., to plasma, the nitrogen concentration near the interface is higher than that near the surface. This also demonstrates that the nitrogen profile in the film can be controlled.

Next, a second embodiment of the present invention will be described.

Figure 10:
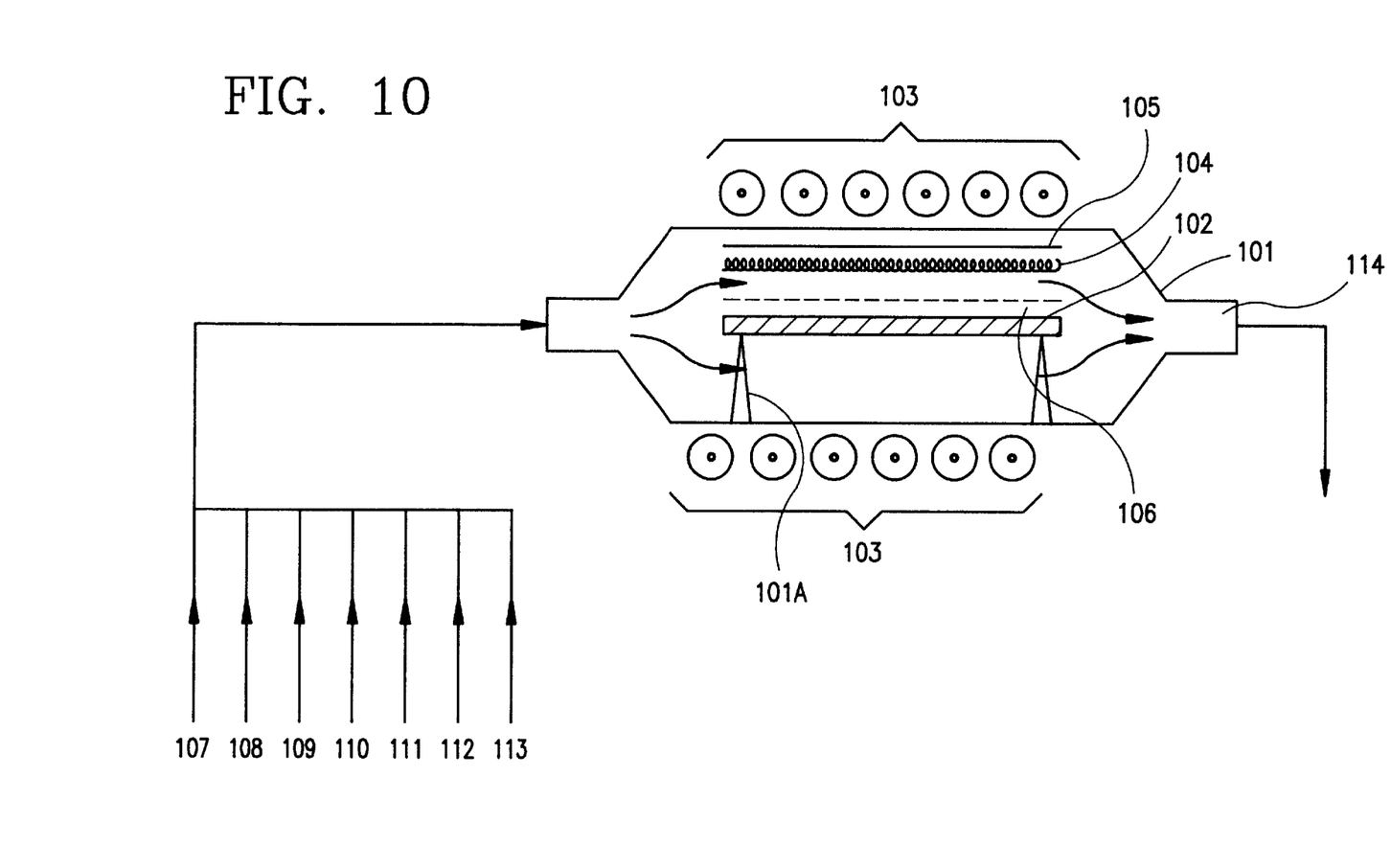
FIG. 10 is a schematic view showing an apparatus for forming an insulating film on semiconductor substrate surface according to a second embodiment of the present invention.

FIG. 10 shows a schematic configuration of an apparatus for forming an insulating film on the surface of a semiconductor substrate.

As shown in FIG. 10, in a horizontally elongated chamber 101, a semiconductor substrate 102 is supported horizontally on support pins 101A. The chamber 101 is formed of stainless steel SUS 316 and has a volume of about 18000 $cm^3$.

A thermoelectron source (tungsten filament) 104, a grid electrode 105, and a mesh electrode 106 are provided at an upper portion of the chamber 101. A voltage can be applied to both ends of the filament 104 so as to heat the filament 104 in order to release thermoelectrons from the heated filament 104. A voltage can be applied to the grid electron 105 so as to accelerate thermoelectrons released from the filament 104.

A voltage can also be applied to the mesh electrode 106 and the semiconductor substrate 102. Through adjustment of the applied voltages, incident charge on the surface of an insulating film can be made zero, to thereby prevent the charge-up effect on the insulating film. Halogen lamps 103 are located above and under the chamber 101. The chamber 101 has quartz glass windows at portions corresponding to the halogen lamps 103. The halogen lamps 103 are adapted to heat the semiconductor substrate 102.

In the above-mentioned apparatus for forming an insulating film, an oxygen introduction line 107, a water vapor introduction line 108, a nitrogen gas introduction line 109, an $N_2O$ gas introduction line 110, an NO gas introduction line 111, an argon gas introduction line 112, and an HF gas introduction line 113 are connected to the left-hand end (FIG. 10) of the chamber 101. These gases react singly or in combination on the surface of the semiconductor 102. The introduced gas (gases) is evacuated from an evacuation port 114 located at the right-hand end (FIG. 10) of the chamber 101. An actual apparatus has a semiconductor substrate transfer mechanism, a control unit, a power unit, a temperature measurement unit, etc. The present embodiment merely refers to a chamber and its peripheral portion related to an actual process and to voltage application.

Next will be described a process of forming an insulating film on a substrate through use of an apparatus having the above-described structure. In this case, a single crystalline silicon substrate having a diameter of 200 mm and a surface area of 314 $cm^2$ was used as the semiconductor substrate 102.

First, the semiconductor substrate (single crystalline silicon substrate) 102 was set in a predetermined position within the chamber 101. In order to remove a native oxide film from the surface of the substrate 102, anhydrous HF gas was introduced into the chamber 101 at a flow rate of 20 cc/min for about 30 seconds.

As a result, the native oxide film was completely removed from the surface of the semiconductor substrate (single crystalline silicon substrate) 102, and a clean silicon surface was exposed.

Next, while oxygen gas was being introduced into the chamber 101 at a flow rate of 5000 cc/min, the semiconductor substrate (single crystalline silicon substrate) 102 was heated by the halogen lamps 103 such that the substrate surface temperature becomes 1000° C. Heating at the temperature was maintained for 120 seconds. As a result, a silicon dioxide film having a thickness of 8 nm was formed on the surface of the substrate 102. At this time, through the introduction of water vapor instead of oxygen or together with oxygen, a silicon dioxide film having a predetermined thickness will be able to be obtained at a lower temperature.

Subsequently, the chamber 101 was evacuated. Then, nitrogen gas was introduced into the chamber 101 so as to establish a pressure of 0.5 Torr within the chamber 101. In this case, the flow rate of nitrogen gas was 50 cc/min.

Next, the filament 104 was activated so that it was heated to a temperature of 1300° C. A voltage of 23 V with respect to the filament 104 was applied to the grid electrode 105 so as to generate nitrogen plasma through electron impact on nitrogen molecules.

In this case, a voltage of −5 V with respect to the grid electrode 105 was applied to the mesh electrode 106. A voltage of −10 V with respect to the grid electrode 105 was applied to the semiconductor substrate (single crystalline silicon substrate) 102. The substrate 102 was heated by the halogen lamps 103 such that the substrate surface temperature becomes 400° C. In this state, a silicon dioxide film was exposed to nitrogen plasma for 1 hour, thereby modifying the silicon dioxide film.

Also, in the present embodiment, the nitrogen atom concentration of an insulating film and the depthwise profile of nitrogen atoms contained in the insulating film can be easily controlled through adjustment of the following factors: the heating temperature of the semiconductor substrate (single crystalline silicon substrate) 102; the flow rate of nitrogen gas introduced into the chamber 101; time for which an insulating film is exposed to plasma; the temperature of the filament 104; and a voltage applied to the grid electrode 105.

After an oxynitride film is formed on the surface of the semiconductor substrate (single crystalline silicon substrate) 102, an MOS device can be fabricated in accordance with the MOS capacitor fabrication flow of FIG. 1.

The present embodiment has been described while nitrogen gas is employed. However, the object of the present invention can be achieved through use of any compound gas other than nitrogen gas so long as nitrogen atoms are contained. Examples of such a compound gas include $N_2O$ gas, NO gas, and ammonia. In this case, argon gas, neon gas, or like gas may be mixed in.

The present embodiment has been described while the semiconductor substrate 102 is heated at a temperature of 400° C. However, the substrate heating temperature is not limited thereto. The substrate 102 may be heated at a temperature of 0° C. to 700° C.

The present embodiment has been described while the halogen lamps 103 are used to heat the surface of the semiconductor substrate 102. A heating method is not limited thereto. Resistance heating may be employed.

The first and second embodiments have been described while a single crystalline silicon substrate is used as a semiconductor substrate. However, substrate material is not limited thereto. The semiconductor substrate may be of polycrystalline silicon, amorphous silicon, gallium arsenide, indium phosphide, silicon germanium, silicon germanium carbide, or silicon carbide.

The present invention is not limited to the above-described embodiments. Numerous modifications and variations of the present invention are possible in light of the spirit of the present invention, and they are not excluded from the scope of the present invention.

What is claimed is:

1. A method for treating an insulating film on a surface of a semiconductor substrate, comprising the steps of:
   a) providing a source of thermoelectrons;
   b) generating thermoelectrons with said source;
   c) accelerating said thermoelectrons;
   d) impacting said accelerated thermoelectrons on a gas, thereby generating a plasma; and
   e) exposing the insulating film to said plasma.

2. A method for treating an insulating film on the surface of a semiconductor substrate according to claim 1, wherein the insulating film on the surface of the semiconductor substrate is a silicon oxide film having a thickness of 1–20 nm.

3. A method for treating an insulating film on the surface of a semiconductor substrate according to claim 1, wherein plasma is generated by electron impact on a gas selected from the group consisting of a nitrogen-atom-containing compound gas, nitrogen, dinitrogen monoxide ($N_2O$), nitrogen monoxide (NO), and ammonia.

4. A method for treating an insulating film on the surface of a semiconductor substrate according to claim 1, wherein the semiconductor substrate is formed of at least a single material selected from the group consisting of single crystalline silicon, polycrystalline silicon, amorphous silicon, gallium arsenide, indium phosphide, silicon carbide, silicon germanium, and silicon germanium carbide.

5. A method for treating an insulating film on the surface of a semiconductor substrate according to claim 1, wherein the insulating film formed on the surface of the semiconductor substrate is a film formed through thermal oxidation, chemical vapor-phase growth, chemical oxidation, plasma-assisted chemical vapor-phase growth, or physical vapor-phase growth.

6. A method for treating an insulating film on the surface of a semiconductor substrate according to claim 1, wherein said treating forms two peaks of nitrogen concentration in the insulating film, one near the surface of the film and the other near the interface between the insulating film and the semiconductor substrate and wherein the peaked nitrogen concentrations range between 0.1 atomic % and 60 atomic %.

7. A method according to claim 1, wherein said steps of providing, generating, accelerating, impacting and exposing more specifically comprise:
   1) providing a metal chamber;
   2) providing a filament and a first electrode in said chamber;
   3) positioning said semiconductor substrate in said chamber with said insulating film below said filament and said first electrode;

5) introducing a gas into said chamber;

6) applying a first voltage to said filament to generate said thermoelectrons; and 7) applying a second voltage to said first electrode to accelerate said thermoelectrons, and impact said gas with said thermoelectrons, thereby generating said plasma, and exposing said insulating film to said plasma.

8. The method of claim 7, wherein said chamber includes a plurality of quartz windows therein, and said method further comprises the steps of providing a plurality of halogen lamps disposed above and under said chamber to supply heat through said quartz windows; and, heating said substrate with said halogen lamps.

9. The method of claim 7, further comprising the steps of providing a second electrode in said chamber, and applying a third voltage across said second electrode and said substrate to prevent charge formation on said insulating film.

10. The method of claim 7, wherein said step of introducing said gas into said chamber more specifically comprises introducing a gas into said chamber that is selected from the group comprising anhydrous HF, oxygen, water vapor, $N_2O$, NO, $NH_3$ and $N_2$.

11. A method according to claim 1, wherein said plasma is generated from a gas containing a member selected from the group consisting of $N_2$, $N_2O$, $NH_3$ and mixtures thereof with an inert gas, dry oxygen and steam-containing oxygen.

* * * * *